United States Patent
Forey et al.

(10) Patent No.: US 10,014,965 B1
(45) Date of Patent: Jul. 3, 2018

(54) OFFSET-COMPENSATED LOSS OF SIGNAL DETECTION METHODS AND SYSTEMS

(71) Applicant: INPHI CORPORATION, Santa Clara, CA (US)

(72) Inventors: Simon Forey, Northamptonshire (GB); Rajasekhar Nagulapalli, Northampton (GB); Parmanand Mishra, Cupertino, CA (US); Michael S. Harwood, Rushden (GB)

(73) Assignee: INPHI CORPORATION, Santa Clara, CA (US)

( * ) Notice: Subject to any disclaimer, the term of this patent is extended or adjusted under 35 U.S.C. 154(b) by 0 days.

(21) Appl. No.: 15/343,653

(22) Filed: Nov. 4, 2016

(51) Int. Cl.
*H04B 17/21* (2015.01)
*H04B 17/318* (2015.01)
*H03K 5/19* (2006.01)
*H03K 3/3565* (2006.01)
*H04L 12/26* (2006.01)

(52) U.S. Cl.
CPC .......... *H04B 17/21* (2015.01); *H03K 3/3565* (2013.01); *H03K 5/19* (2013.01); *H04B 17/318* (2015.01); *H04L 43/16* (2013.01)

(58) Field of Classification Search
CPC ..... H04L 43/16; H04L 7/0083; G06F 1/3287; H04B 17/318
See application file for complete search history.

(56) References Cited

U.S. PATENT DOCUMENTS

| | | | | |
|---|---|---|---|---|
| 9,515,852 | B1* | 12/2016 | Mishra | H04L 25/0262 |
| 2004/0030513 | A1* | 2/2004 | Kocaman | H03L 7/091 |
| | | | | 702/79 |
| 2007/0271054 | A1* | 11/2007 | Chen | H04L 25/0274 |
| | | | | 702/85 |
| 2014/0105265 | A1* | 4/2014 | Ho | H03M 1/001 |
| | | | | 375/224 |
| 2016/0197736 | A1* | 7/2016 | Shvarzberg | H04L 12/6418 |
| | | | | 713/310 |

OTHER PUBLICATIONS

Rajeev Dokania et al., "A 5.9pJ/b 10Gb/s Serial Link with Unequalized MM-CDR in 14 nm Tri-Gate CMOS", Advanced Wireline Techniques and PLLs, 2015 IEEE International Solid-State Circuits Conference, Feb. 24, 2015, pp. 184-185, IEEE.
Jri Lee et al., "A Low-Power Low-Cost Fully-Integrated 60-GHz Transceiver System With OOK Modulation and On-Board Antenna Assembly", IEEE Journal of Solid-State Circuits, Feb. 2010, pp. 264-275, vol. 45, No. 2, IEEE.
Laser and Modulator Drivers, Team Ling, pp. 288-289.

* cited by examiner

*Primary Examiner* — David S Huang
(74) *Attorney, Agent, or Firm* — Richard T. Ogawa; Ogawa P.C.

(57) ABSTRACT

The present invention is directed to data communication. According to a specific embodiment, the present invention provides technique for loss of signal detection. A loss-of-signal detection (LOSD) device determines an analog signal indicating signal strength by subtracting a threshold offset voltage from an incoming signal. The analog signal is then processed by a switch network of an output stage circuit, which provides a digital output of loss of signal indication at a low frequency (relative to the incoming signal frequency). There are other embodiments as well.

20 Claims, 8 Drawing Sheets

OFFSET-COMPENSATED LOSS OF SIGNAL DETECTION METHODS AND SYSTEMS

CROSS-REFERENCES TO RELATED APPLICATIONS

NOT APPLICABLE

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention is directed to data communication.

Over the last few decades, the use of communication networks exploded. In the early days of the Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500TB of data daily. With such high demands on data and data transfer, existing data communication systems need to be improved to address these needs. For high-data communication applications, serializer/deserializer (SERDES) are often used.

Over the past, there have been many types of communication systems and methods. Unfortunately, they have been inadequate for various applications. More specifically, detecting loss of signal can be challenging. Therefore, improved systems and methods are desired.

BRIEF SUMMARY OF THE INVENTION

The present invention is directed to data communication. According to a specific embodiment, the present invention provides technique for loss of signal detection. A loss-of-signal detection (LOSD) device determines an analog signal indicating signal strength by subtracting a threshold offset voltage from an incoming signal. The analog signal is then processed by a switch network of an output stage circuit, which provides a digital output of loss of signal indication (Logic high means no Signal and logic Low means signal presents). There are other embodiments as well.

According to an embodiment, the present invention provides a loss-of-signal detection device. The device includes a pair of input signals including a first input signal and a second input signal. The first signal is characterized by a first frequency. The device includes a first hysteresis voltage source that is configured to add a first predetermined hysteresis voltage to the first input signal to provide a first adjusted signal. The device also includes a second hysteresis voltage source that is configured to add a second predetermined hysteresis voltage to the second input signal to provide a second adjusted signal. The device further includes a bias voltage source being configured to provide a bias voltage. The device additionally includes a first transistor comprising a first gate and a first source. The first adjusted signal is coupled to the first gate. The device also includes a second transistor comprising a second gate and a second source. The second adjusted signal is coupled to the second gate. The device further includes a third transistor comprising a third gate and a third source a first drain. The third gate is coupled to the bias voltage. The third source is coupled to the first source and the second source. The device also includes an output module comprising a switch network and a latch. The switch network is configured to generate an intermediate signal using a strength indicator signal received from the first drain of the third transistor and an offset associated at least with the first transistor and the second transistor. The latch is configured to generate a loss-of-signal indicator based on the immediate signal at a second frequency. The second frequency is lower than the first frequency.

According to another embodiment, the present invention provides a SerDes receiver apparatus, which includes a first input terminal comprising a first inductor is configured to receive a first input signal. The apparatus also includes a second input terminal comprising a second inductor and is configured to receive a second input signal. The apparatus also includes an equalizer module that is configured to process the first input signal and second input signal. The apparatus additionally includes a core module that includes a first transistor and a second transistor and is coupled to first input terminal and a second input terminal. The core module is configured to generate an input strength signal using at least the first input signal and the second input and a bias signal. The first transistor is coupled to the first input signal. The second transistor is coupled to the second input signal. The apparatus also includes an output module that is configured to generate a loss-of-signal indicator using at least the input strength signal and an offset associated with the first transistor and the second transistor.

According to yet another embodiment, the present invention provides a loss-of-signal detection device. The device includes a pair of input signals including a first input signal and a second input signal. The first signal is characterized by a first frequency. The device also includes a bias voltage source that is configured to provide a bias voltage. The device further includes a first transistor comprising a first gate and a first source. The first input signal is coupled to the first gate. The device further includes a second transistor that has a second gate and a second source. The second input signal is coupled to the second gate. The device also includes a third transistor comprising a third gate and a third source a first drain. The third gate is coupled to the bias voltage. The third source is coupled to the first source and the second source. The device additionally includes an output module comprising a switch network and a latch. The switch network is configured to generate an intermediate signal using a strength indicator signal received from the first drain of the third transistor and an offset associated at least with the first transistor and the second transistor. The switch network includes a first capacitor for storing the intermediate signal and second capacitor for storing the offset the latch being configured to generate a loss-of-signal indicator based on the immediate signal at a second frequency. The second stage frequency is much lower than the first frequency.

It is to be appreciated that embodiments of the present invention provide many advantages over conventional techniques. Among other things, LOSD devices according to the present invention operate in frequency levels that are much lower than the data frequency, and the low frequency levels reduce power consumption and system resource usage. Additionally, LOSD devices according to the present invention have minimal impact on the communication systems. LOSD devices described herein are characterized by low input capacitance, which translates to minimal impact on the receiver band width and return loss. Various operating parameters, such as threshold voltage and hysteresis voltage, are adjustable, and thus it is possible to utilize LOSD devices according to embodiments of the present invention in a variety of applications and operating conditions. Furthermore, LOSD devices according to the present invention are characterized by low input referred noise, low input referred offset, and low power consumption. For example, in comparison to existing LOSD devices, embodiments of the present invention take advantage of digital control and transistor speed and offer higher performance and efficiency.

Embodiments of the present invention can be implemented in conjunction with existing systems and processes. For example, LOSD devices, which include digital components and transistor elements, can be manufacturing using existing manufacturing equipment and techniques. Additionally, it is to be appreciated that LOSD devices according to the present invention can be used in conjunction with existing communication systems and devices, such as SerDes, transceivers, communication interfaces, and/or others. For example, LOSD devices can be integrated on the same chip as communication systems and/or devices. There are other benefits as well.

The present invention achieves these benefits and others in the context of known technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

Figure 1:
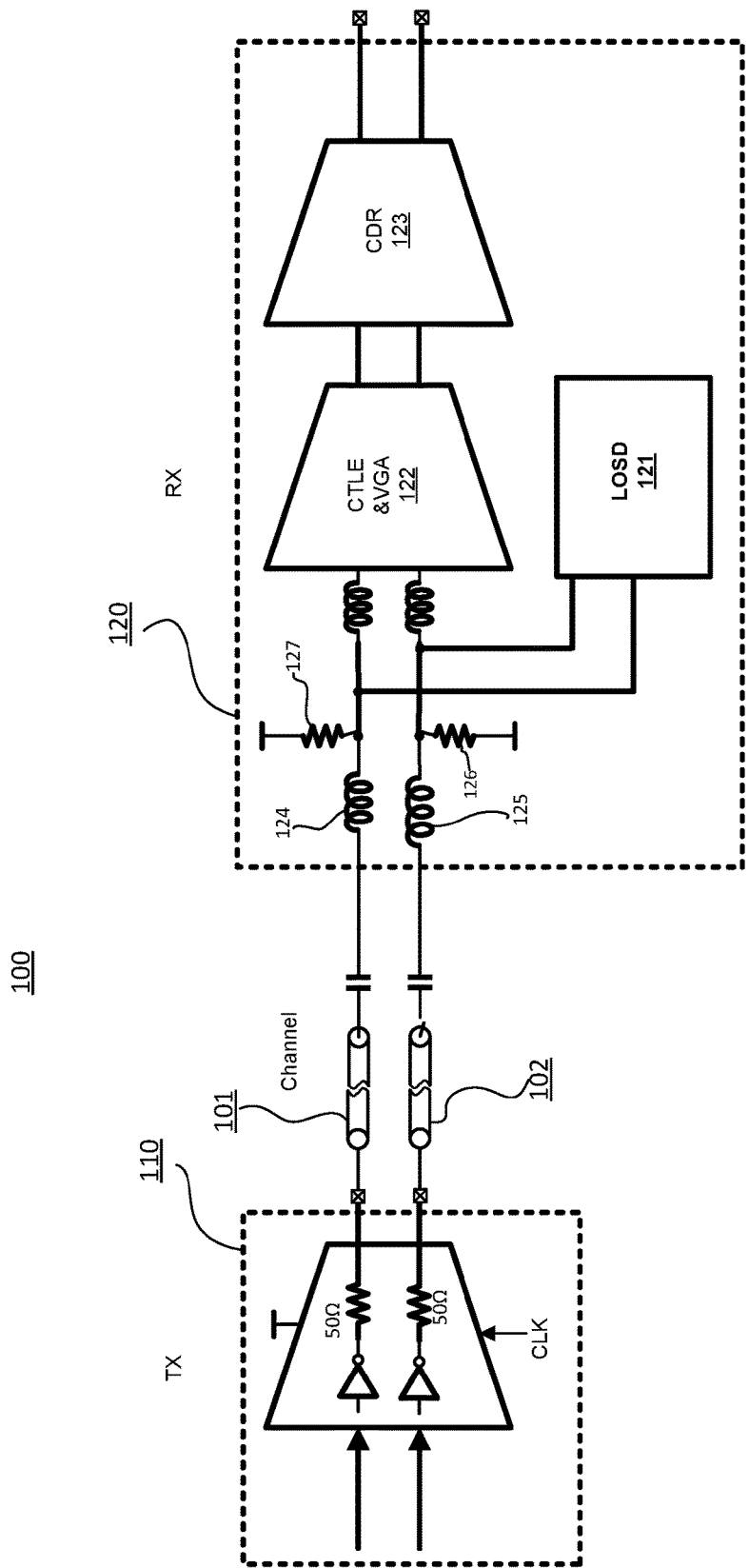
FIG. 1 is a simplified diagram illustrating a data transmission system according to an embodiment of the present invention.

The present invention is directed to data communication. According to a specific embodiment, the present invention provides technique for loss of signal detection. A loss-of-signal detection (LOSD) device determines an analog signal indicating signal strength by subtracting a threshold offset voltage from an incoming signal. The analog signal is then processed by a switch network of an output stage circuit, which provides a digital output of loss of signal indication at a low frequency (relative to the incoming signal frequency). There are other embodiments as well.

As mentioned above, data communication system systems and devices (such as SerDes) often require a loss of signal (LOS) detector that indicates whether a signal is present on the high-speed receiver terminal. For example, an LOS detector allows a system to power down to save power if signal is not present at the receiver terminal. Often, to detect whether signal is present, signal strength is examined to see if the signal has enough amplitude for sampling. Additionally, data frequency of the incoming signal is examining to see if this frequency is within the operable range of the system. Over the past, there have been conventional techniques for LOS detection, but they are often inadequate for having negative impact on signal integrity and large power/area overhead. It is thus to be appreciated that embodiments of the present invention provide improved techniques of LOS detection.

Among other requirements, a LOS detection (LOSD) device itself should not contribute to degradation of system performance. It is thus to be appreciated that LOSD devices and techniques according to the present invention provide low input capacitance, flexibility via threshold adjustment and hysteresis adjustment, low input referred noise and offset, and low power consumption.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

FIG. 1 is a simplified diagram illustrating a data transmission system according to an embodiment of the present invention. This diagram is merely an example, which should not unduly limit the scope of the claims. One of ordinary skill in the art would recognize many variations, alternatives, and modifications. As shown in FIG. 1, data are transferred from transmitter 110 to receiver 120 via communication channels 101 and 102. For example, optical communication links are used to implement communication channels 101 and 102. In various embodiments, transmitter 110 performs signal modulation to generate analog signal for transmission over a high-speed communication network (e.g., communication links 101 and 102). For example, communication signals transmitted from transmitter 110 to receiver 120 are transmitted in pairs (i.e., a positive signal and a negative signal as a differential pair). Once incoming signals are received, receiver 120 processes the received signals accordingly. In certain implementations, receiver 120 includes inductor 124 and inductor 125 that precede connection to LOSD module 121. It is to be appreciated that inductor 124 and inductor 125 reduce the impact of LOSD module 121 on the return loss. Also preceding the LOSD module 121 is a pair of resistors 127 and 126. For example, resistor 126 and resistor 127 may be implemented using relatively low resistance value (e.g., 50 ohms) in relation to the LOSD module. To process the incoming signal, continuous time linear equalizer (CTLE) and variable gain amplifier (VGA) components are used, which is shown as functional block 122. Depending on the application, CTLE, VGA, and/or other components may be used to adjust the received analog signals for further processing. A clock and data recovery (CDR) module 123 is configured to generate clock signal based on the signal processed by the CTLE/VGA module 122. For example, the CDR module 123 generates clock signal based on the received signal. It is to be noted that the LOSD module 121 connects to the communication links 101 and 102 right after, respectively, inductors 124 and 125, before any processing by CTLE/VGA module 122, thereby allowing realistic determination and measurement of signal characteristics (e.g., signal strength as measured in terms of amplitude).

The LOSD module 121, as shown, is connected to the input terminal. Among other things, the LOSD module 121 minimizes its impact on the input signals and other components of the of communication system. In certain embodiments, the output of LOSD module 121 is used by a communication system to decide whether to process input signal. That is, if the LOSD module indicates that the signal is lost and whatever received as input signal is likely to be noise, the communication system may stop processing input signal to conserve power.

LOSD module 121 in FIG. 1 is shown with other components (CTLE, VGA, CDR, etc.). Depending on the implementation, LOSD module 121 can be implemented with other system components in lieu of or in combination with components shown in FIG. 1. In a specific embodiment, the LOSD module is implemented as a component of a SerDes device, which is itself is a part of a larger communication system.

Figure 2A:
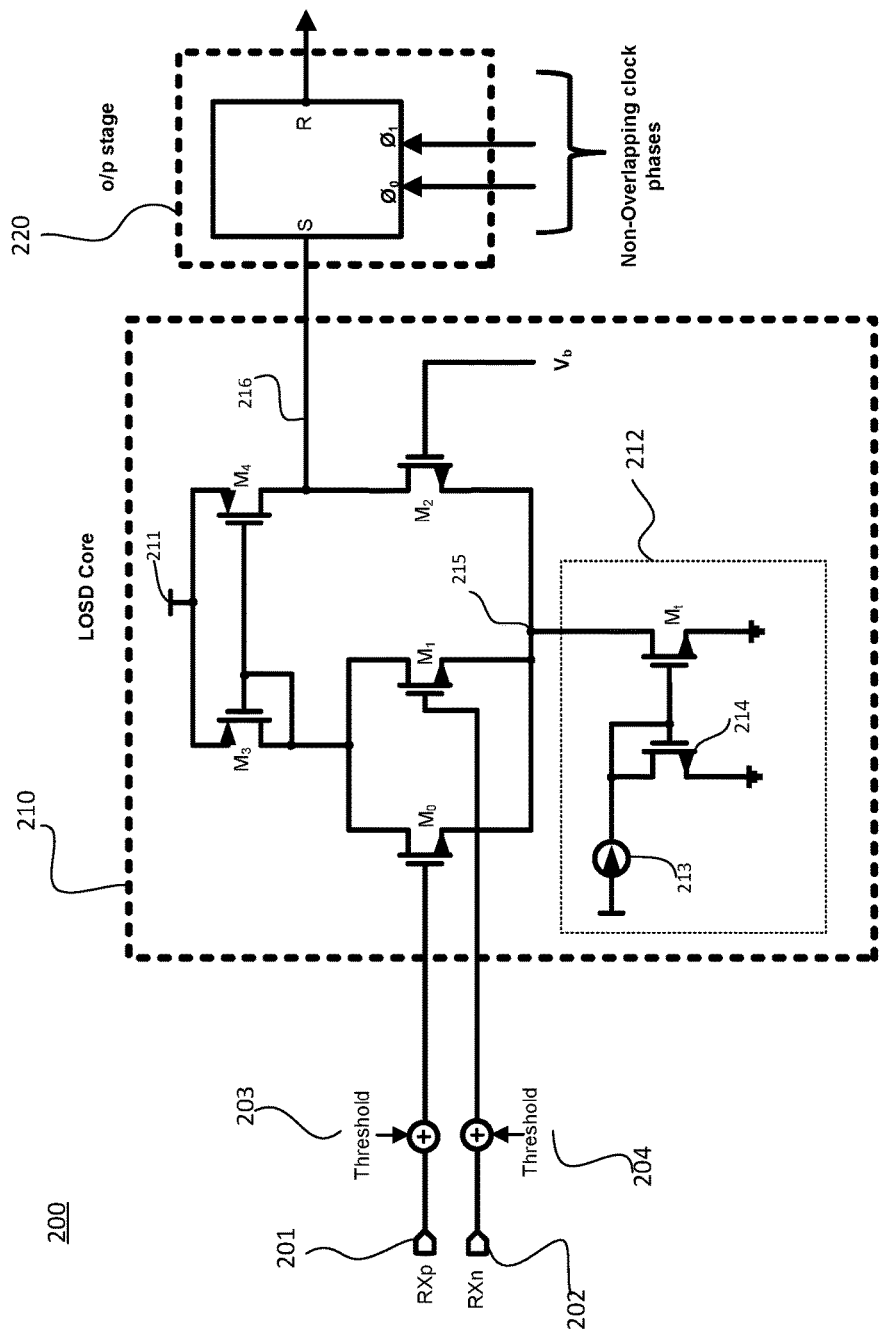
FIG. 2A is a simplified diagram illustrating a loss-of-signal detection device according to an embodiment of the present invention.
Figure 2B:
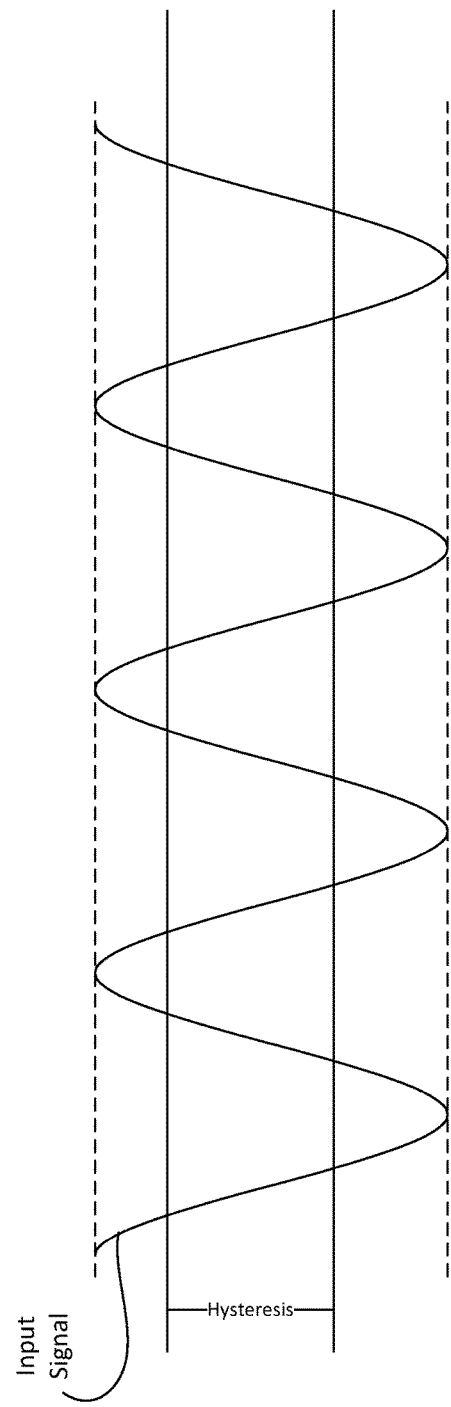
FIG. 2B is a graph illustrating a hysteresis voltage according to an embodiment of the present invention.

FIG. 2A is a simplified diagram illustrating a loss-of-signal detection device 200 according to an embodiment of the present invention. This diagram is merely an example, which should not unduly limit the scope of the claims. One of ordinary skill in the art would recognize many variations, alternatives, and modifications. As shown in FIG. 2A, incoming signals are received as a pair. For example, terminal 201 is coupled to the received positive signal "$RX_p$", and terminal 202 is coupled to received negative signal "$RX_n$". Threshold buffer voltages (or hysteresis compensation voltage) are applied to received input signals at terminals 203 and 204 respectively. In various embodiments, terminals 203 and 204 are coupled to voltage source controlled by digital-to-analog converter (DAC), which generate hysteresis compensation voltages. FIG. 2B is a graph illustrating a hysteresis voltage according to an embodiment of the present invention. Input signal as shown has a predetermined peak-to-peak amplitude. Depending on the signal strength and the communication system, the input signal may include noise. By providing a hysteresis voltage compensation mechanism, as shown in FIG. 2B, fluctuation of input signal within the hysteresis range as shown would not influence threshold passing of voltages. For example, the hysteresis voltage is usually selected as a low value (e.g., 20 mV) compared to the peak-to-peak voltage (e.g., 1V) of the input signal. It is to be appreciated that the hysteresis voltage as implemented according to embodiments of the present invention is used to prevent several quickly successive changes if the input signal contains some noise. For example, the hysteresis voltage level (or threshold) may be determined and set by a system logic and/or a DAC. Depending on the specific application, high amplitude signals may require a high hysteresis voltage, while low amplitude signals may use small hysteresis voltage.

Now referring back to FIG. 2A. The input signals, after compensated respectively at terminals 203 and 204, are applied to gate terminals of switches $M_0$ and $M_1$. As an example, the LOSD device 200 are implemented using NMOS and PMOS transistors as shown. It is to be appreciated that other types of switches (e.g., different combinations of PMOS and NMOS transistors, or different types of switches altogether) may be used as well. More specifically, switches $M_3$ and $M_4$ are implemented using NMOS transistors, and switches $M_0$, $M_1$, $M_2$, and $M_t$ are implemented using PMOS transistors. The drain terminals of switches $M_0$ and $M_1$ are both coupled to the supply voltage terminal 211 (e.g., supply voltage $V_{DD}$) via switches $M_3$ and $M_4$. The source terminals of switches $M_0$ and $M_1$ are coupled to terminal 215, which is also coupled to switch $M_2$ and the long tail section 212. Among other features, long tail section 212 includes a pair of switches (e.g., switch $M_t$ and switch 214) and a current source 213 as shown. For example, long tail section 212 resembles function and configuration of long tail section of differential amplifiers.

Figure 2C:
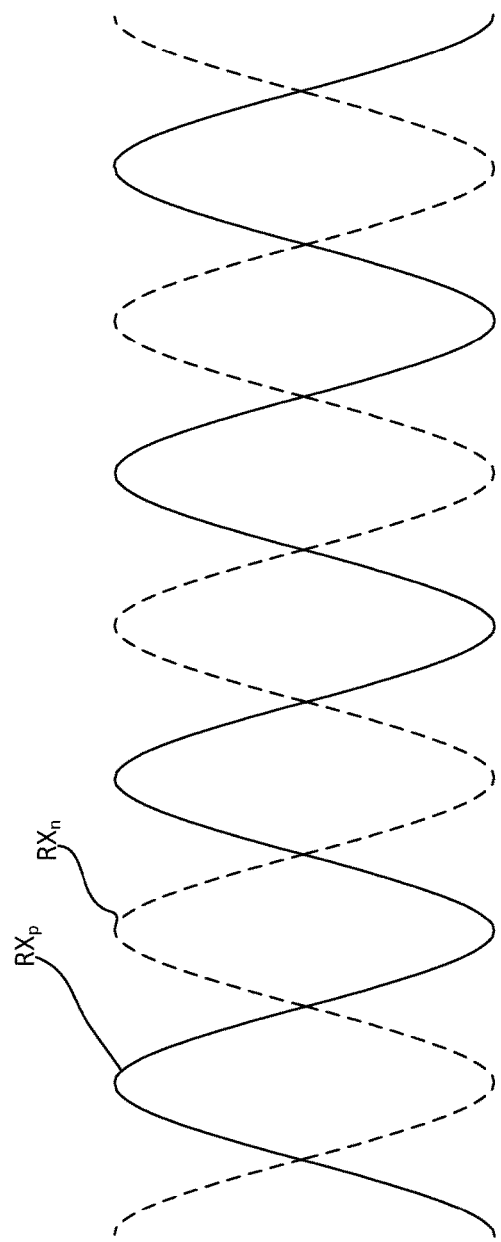
FIG. 2C is a simplified diagram illustrating input signals according to embodiments of the present invention.

Terminal 215 is coupled to the source terminals of switches $M_0$ and $M_1$, and it is also coupled to the drain terminal switch $M_t$ and the source terminal of switch $M_2$ As mentioned above, signals $RX_p$ and $RX_n$ are a differential pair, and the sum of $M_0$ and $M_1$ would be substantially zero as there is no signal. FIG. 2C is a simplified diagram illustrating input signals according to embodiments of the present invention. As can be seen in FIG. 2C, signals $RX_p$ and $RX_n$ are in opposite phase against each other, which means when adding these two signals together, they would cancel each out each other, and the sum of these two signals would be zero. On other hand, when $RX_p$ and/or $RX_n$ are carrying signals, the sum between the two signals would be non-zero. It is to be appreciated that depending on the signal strength and signal to noise ratio, the sum between two signals $RX_p$ and $RX_n$ may be at different magnitude, depending on the amplitudes of the input signals.

Now referring back to FIG. 2A. As explained above, the sum of $RX_p$ and $RX_n$ through switches $M_0$ and $M_1$ depends on the amplitudes of the input signals. The output of the LOSD core 210 is a signal strength indication based on the $RX_p$ and $RX_n$ from switches $M_0$ and $M_1$, where switches $M_3$ and $M_4$ subtract the sum of $M_0$ and $M_1$ output with the bias current from switch $M_2$. As shown in FIG. 2A, gate of switch $M_2$ is coupled to bias voltage $V_b$, which provides the bias current for switch $M_2$. The drain terminal of switch $M_4$ is coupled to terminal 216. If the sum of signals $RX_p$ and $RX_n$ is greater than the bias current from switch $M_2$, the output of LOSD core 210 at terminal 216 would be non-zero, indicating the presence of signal. On the other hand, if the sum of signals $RX_p$ and $RX_n$ is less than the bias current from switch $M_1$, the output of the LOSD core 210 at terminal 216 would be zero (or lower), indicating that there is no signal or the signal is lost. The drain terminal of switch $M_4$ is coupled to terminal 216 and indicates signal strength of the input signals (i.e., sum of input signals less bias signal from $V_b$). Output stage module 220 generates a loss of signal indication using the output of LOSD core at terminal 216. Operation of output stage module 220 is illustrated in FIG. 3 and described below.

The amplitude of the bias voltage $V_b$ dictates the sensitivity of loss-of-signal detection. Since output at terminal 216 is essential the difference between sum of input signals and $V_b$, large $V_b$ translates to low sensitivity, while small $V_b$ translates to high sensitivity. Depending on the signal strength and/or system implementation, bias voltage $V_b$ may be set accordingly. In various embodiments, the amplitude of the bias voltage $V_b$ is predetermined and/or computed based on the input signal received at terminals 201 and 202. For example, for input signal with relatively high signal strength, a high $V_b$ is used; for input signal with relatively low signal strength, a low $V_b$ is used. It is to be appreciated that setting $V_b$ too high would bring false positives (i.e., indicating loss of signal when actual signals are present); setting $V_b$ too low would bring false negatives (i.e., indicating signal present when there is no signal but noise high enough to be mistaken as signals). The output stage 220 is implemented using, among other components, a set-reset (SR) latch. It is to be appreciated that the output stage 220 operates at a much lower frequency than the input signal, which translates to high energy efficiency and low power consumption. For example, an input signal at a rate of 28 GHz, the output stage 220 may operate at a low rate of 10 MHz. In various embodiments, the operating frequency of output stage 220 is at least 100 times lower than the input signal frequency.

Figure 3:
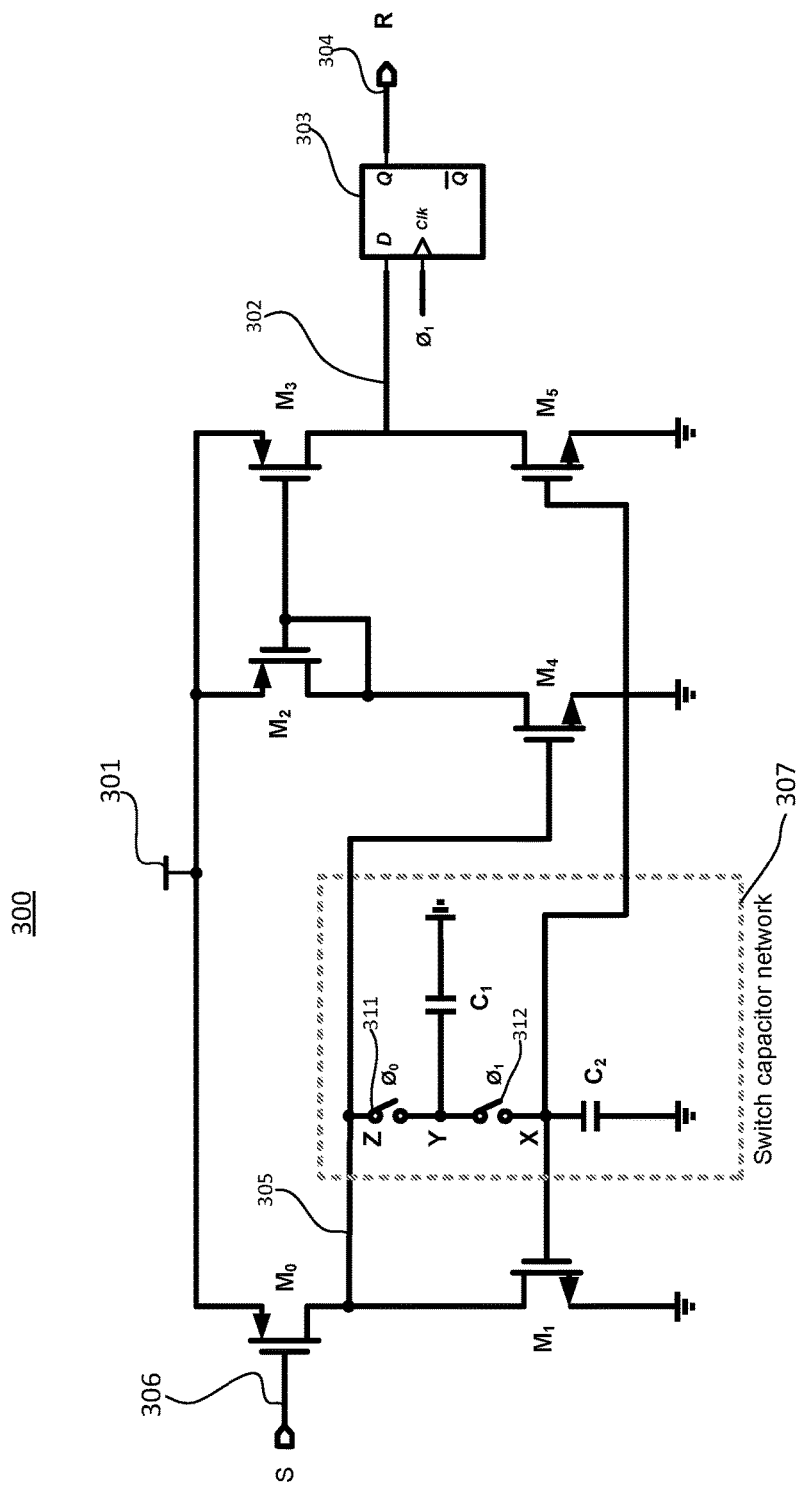
FIG. 3 is a simplified diagram illustrating an output stage module 300 according to an embodiment of the present invention.

FIG. 3 is a simplified diagram illustrating an output stage module 300 according to an embodiment of the present invention. This diagram is merely an example, which should not unduly limit the scope of the claims. One of ordinary skill in the art would recognize many variations, alternatives, and modifications. As explained above, output stage module 300 is implemented using, among other components, an SR latch. For example, signal is received at the "S" terminal 306, and output (i.e., loss of signal indication) is provided at the "R" terminal 304. For example, the signal received at terminal 306 is based on the output of the LOSD core 210 at terminal 216 in FIG. 2A, and the signal from the LOSD core indicates signal strength and potential loss of signal. Output stage module 300 is configured to, taking common mode offset under consideration, generate digital output ("0" and "1") that indicates whether the signal is lost at a predetermined Amplitude.

Output stage module 300 includes a switch capacitor network 307 that is coupled to the input transistor $M_0$. Among other things, switch capacitor network 307 uses capacitor $C_2$ to store an offset voltage associated with a common mode of the LSOD core. The offset voltage stored at capacitor $C_2$ is then to be subtracted from the signal strength (or loss of signal indication) voltage based on the signal received from the LSOD core and stored at capacitor $C_2$. The voltages stored at capacitors $C_1$ and $C_2$ are controlled by switches 311 and 312. In various embodiments, a control logic (not shown) is implemented with the LOSD device, and the control logic provides control signal to operate the switches 311 and 312 and the flip flop 303.

Output stage module 300 operates in two operating phases $\emptyset_0$ and $\emptyset_1$. Phase $\emptyset_1$ is used to determine and store common mode offset voltage, which is to be stored at capacitor $C_2$. During $\emptyset_0$ phase, gate of switch $M_0$ receives an input signal (containing signal strength information) the LOSD core, and switch 311 is closed to charge capacitor $C_1$. During $\emptyset_1$ phase, switches 311 and 312 are both closed, and capacitor $C_2$ is charged up. For example, the voltage $V_2$ of capacitor $C_2$ is $$\frac{C_1 V_1}{C_1 + C_2},$$

where $V_1$ is the voltage on capacitor $C_1$. Through phase $\emptyset_0$ and $\emptyset_1$, amplitude information of signal strength (received from the LOSD core) and common mode offset are respectively stored at capacitors $C_1$ and $C_2$. Through the network of switches (i.e., switches $M_1$, $M_2$, $M_3$, $M_4$, and $M_5$), amplitude information less the common mode offset is provided at terminal 302, which is coupled to the "D" terminal of the flip-flop 303. As can be seen in FIG. 3, phase $\emptyset_1$ is also used as the clock input for the flip-flop 303. Based on the timing of phase $\emptyset_1$ as the input, flip-flop 303 generates a digital output to indication loss of signal (e.g., "0" indicates signal is lost, and "1" indicates that signal is present).

It is to be understood that timing is an important aspect of the operation. For example, for the voltage $V_2$ at capacitor $C_2$ to settle, it takes a number of clock cycles for the transistor $M_1$. Switches $M_3$ and $M_4$ are configured to subtract currents corresponding to both phases (i.e., $\emptyset_1$ and $\emptyset_0$) and Generate a voltage which at the drain terminal of switch $M_3$, which is sampled through flip-flop 302 during phase $\emptyset_1$. In various implementations, capacitor $C_2$ is characterized by a much higher capacitance than capacitor $C_1$, thereby ensuring efficiency of charge transfer during operation and minimize leakage current from capacitor $C_2$.

As shown in FIG. 3, switches $M_0$ through $M_5$ of the output stage module 300 are implemented using PMOS and NMOS transistors. More specifically, switch $M_0$ comprises an NMOS transistor, switch $M_1$ comprises a PMOS transistor, switch $M_2$ comprises an NMOS transistor, switch $M_3$ comprises an NMOS transistor, switch $M_4$ comprises a PMOS transistor, and switch $M_5$ comprises a PMOS transistors. It is to be appreciated that these switches can be implemented using different configurations, which could provide equivalent functions as described above.

Figure 4:
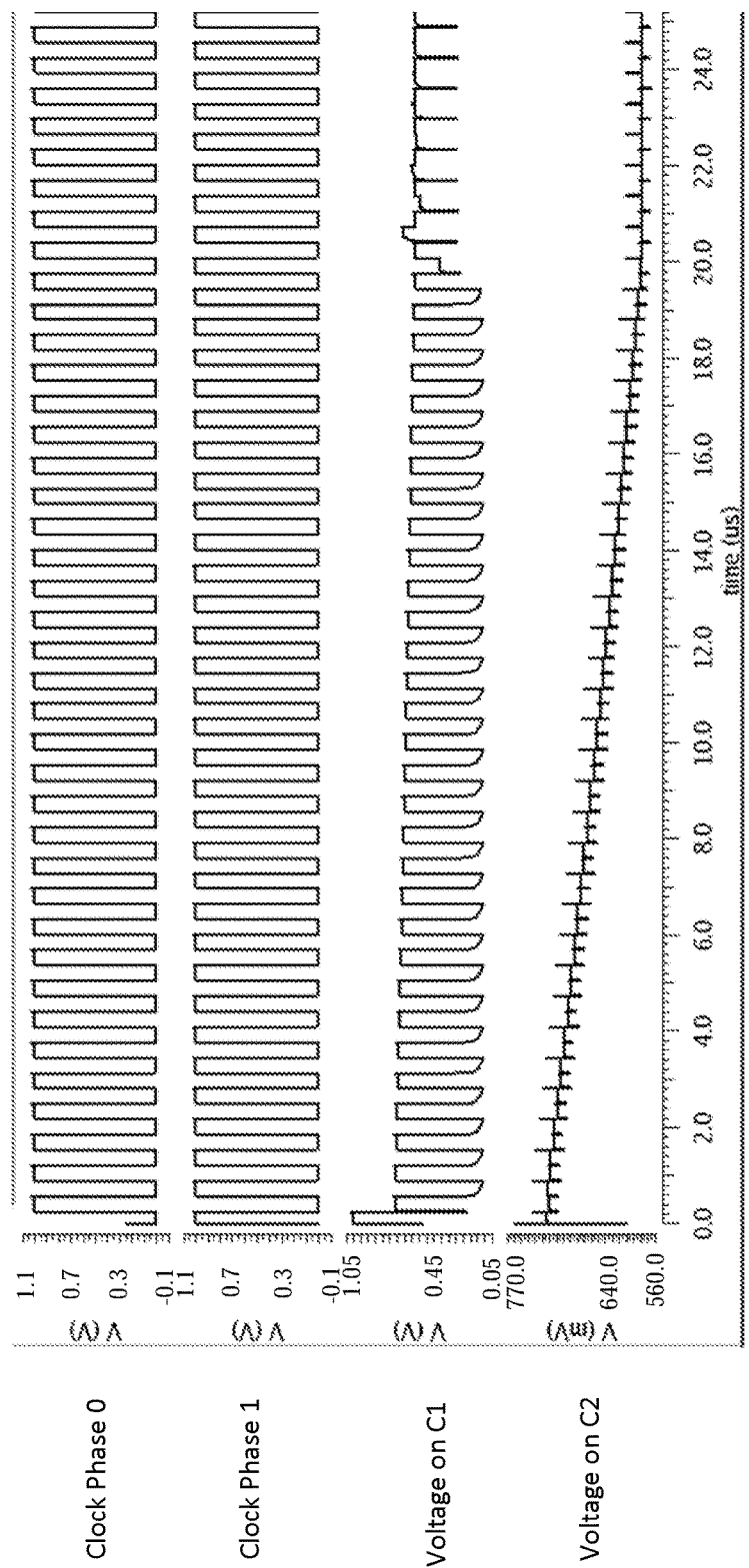
FIG. 4 is a simplified timing diagram illustrating the operation of the output stage module 300 according to an embodiment of the present invention

FIG. 4 is a simplified timing diagram illustrating the operation of the output stage module 300 according to an embodiment of the present invention. This diagram is merely an example, which should not unduly limit the scope of the claims. One of ordinary skill in the art would recognize many variations, alternatives, and modifications. For example, timing waveforms in FIG. 4 provides an example of the operation of output stage module 300 in FIG. 3, as switch capacitor network 300 goes through the process of obtaining signal strength voltage and common mode voltage. As shown in FIG. 4, there are four timing waveforms. On the top, and there are clock phase 0 and clock phase 1, which are used as input signals for the output stage module. On the bottom, the two waveforms correspond respectively to the voltage on capacitor $C_1$ and the voltage on capacitor $C_2$. Clock phase 0 and clock phase 1 signals are both stable and regular, characterized by a magnitude of about 1V. Voltage $V_2$ on capacitor $C_2$ was initially at a magnitude about 770 mV (or 0.77V), and gradually voltage $V_2$ at capacitor $C_2$ drops (and oscillates) until it is stabilized at about 575 mV. Relatively to voltage $V_1$ at capacitor $C_1$, capacitor $C_2$ shares electrical charge with capacitor $C_1$ (i.e., switch 311 and switch 312 both closed during phase $\emptyset_1$). The change of voltage $V_2$ at capacitor $C_2$ as shown is triggered by clock signals (i.e., clock phase 0 and clock phase 1) above, and thus changes appear to be in many steps aligned against the clock signals. For example, during phase $\emptyset_0$, capacitor $C_1$ has been charged, and during phase $\emptyset_1$, common mode voltage from the LOSD module is shared between capacitors $C_1$ and $C_2$. For example, output stage module 300 is configured to output a signal (i.e., digital signal in "0" or "1" to indicate whether the signal is present or lost) when voltage $V_2$ at capacitor $C_2$ is settled (e.g., around 20 micro seconds in FIG. 4).

Figure 5:
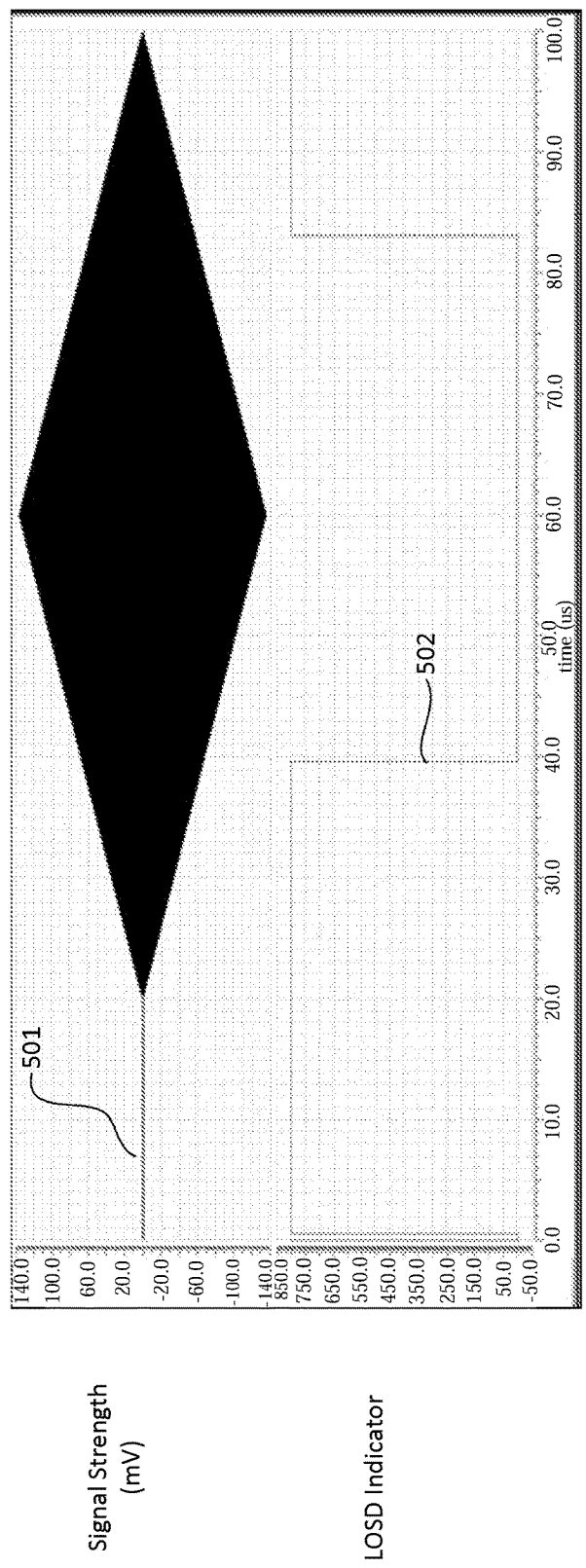
FIG. 5 is a graph illustrating operation of a loss of signal detection module according to an embodiment of the present invention.

FIG. 5 is a graph illustrating operation of a loss of signal detection module according to an embodiment of the present invention. This diagram is merely an example, which should not unduly limit the scope of the claims. One of ordinary skill in the art would recognize many variations, alternatives, and modifications. For example, waveforms in FIG. 5 can be used to operation of the LOSD device 200 and the output stage module 300 described above. Waveform 501 is the differential ramp input voltage, which swings between about +/−140 mV. For example, at around 40 microseconds, the peak-to-peak voltage of waveform 501 is about 100 mV, swinging between −50 mV and 50 mV. For the purpose of illustration, 100 mV peak-to-peak swing voltage is used as the threshold voltage for loss-of-signal detection. Waveform 502 provides a digital read out between "0" and "1". More specifically, when a signal is lost (i.e., no signal detected), waveform 502 is at "1", or 800 mV. In FIG. 5, waveform 502 is at "1" from 0 to 40 microseconds, which corresponds to the time internal when waveform 501 has a peak-to-peak voltage of less than 100 mV. Waveform 501 has a peak-to-peak voltage of greater than 100 mV between about 40 microseconds and 83 microseconds, and during this time, waveform 502 is at "0" (or 0 mV) to indicate that signal is detected. At about 83 microseconds, peak-to-peak voltage of waveform 501 drops below 100 mV, and waveform 502 changes from "0" to "1" output to indicate that signal is lost.

It is to be appreciated that the threshold voltage (e.g., 100 mV for waveform 501) can be set according to the specifically applications. As explained above, threshold voltage can be adjusted using a bias voltage source that is controlled by a DAC. For example, $V_b$ terminal in FIG. 2 can be used to adjust the threshold voltage in determining whether the input signal (e.g., based on differential ramp input or waveform 501) carries a signal. For different signal sources where the received input signal has different amplitudes, the threshold voltage can be set accordingly. In various embodiments, threshold voltage setting is set using threshold setting codes provided by a DAC.

Figure 6:
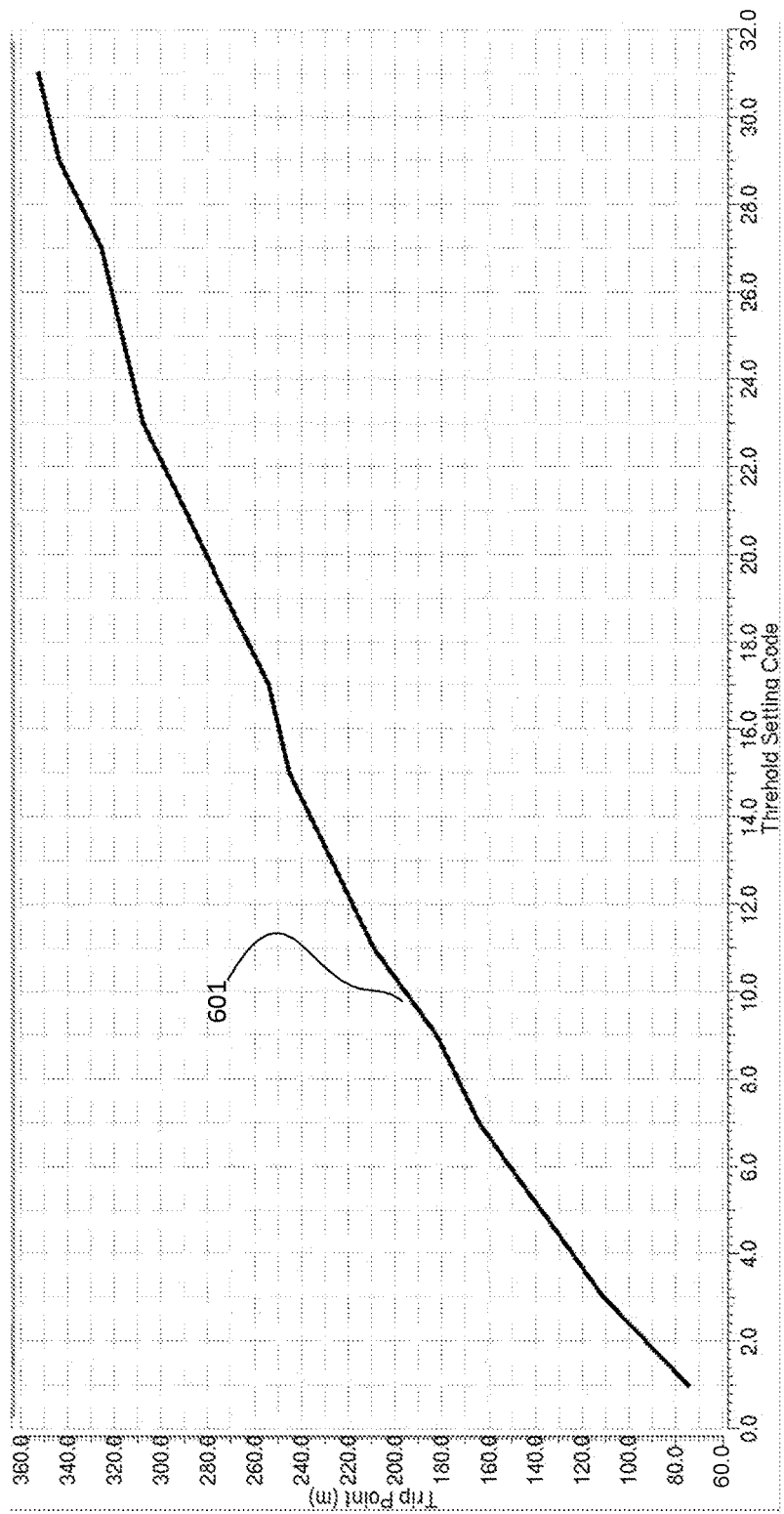
FIG. 6 is a plot illustrating LOS trip point using threshold setting codes according to an embodiment of the present invention.

FIG. 6 is a plot illustrating LOS trip point using threshold setting codes according to an embodiment of the present invention. This diagram is merely an example, which should not unduly limit the scope of the claims. One of ordinary skill in the art would recognize many variations, alternatives, and modifications. On the horizontal axis, threshold codes from 0 to 32 are shown. For example, for a granularity of 32 steps, a 5-bit digital code (i.e., $2^5$) is used. On the vertical axis, trip-point voltage (in mV) is shown. Plot 601 illustrates the relationship between threshold setting code and the trip point. For example, relationship illustrated by plot 601 may be modified depending on the specific implementation. LOSD systems according to embodiments of the present invention may store multiple digital codes for different threshold setting codes and corresponding tipping points. For example, in some embodiments, a logic module of the LOS device calculates and generates threshold setting codes using a predefine algorithm.

It is to be appreciated that the LOSD devices according to embodiments of the present invention can be used in various types of systems. For example, a LOSD device according to a specific embodiment can be implemented as a part of a SerDes device and help process incoming communication signals. Transceivers, network interfaces, and/or other types of communication devices may be implemented with LOSD devices according to embodiments of the present invention.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A loss-of-signal detection device comprising:
 a pair of input terminal for receiving a pair of input signals including a first input signal and a second input signal, the first signal being characterized by a first frequency;
 a first hysteresis voltage source being configured to add a first predetermined hysteresis voltage to the first input signal to provide a first adjusted signal;
 a second hysteresis voltage source being configured to add a second predetermined hysteresis voltage to the second input signal to provide a second adjusted signal;
 a bias voltage source being configured to provide a bias voltage;
 a first transistor comprising a first gate and a first source, the first adjusted signal being coupled to the first gate;
 a second transistor comprising a second gate and a second source, the second adjusted signal being coupled to the second gate;
 a third transistor comprising a third gate, a third source, and a first drain, the third gate being coupled to the bias voltage, the third source being coupled to the first source and the second source; and
 an output module comprising a switch network and a latch, the switch network being configured to generate an intermediate signal using a strength indicator signal received from the first drain of the third transistor and an offset associated at least with the first transistor and the second transistor, the latch being configured to generate a loss-of-signal indicator based on the immediate signal at a second frequency, the second frequency being lower than the first frequency.

2. The device of claim 1 wherein the first transistor is a PMOS transistor.

3. The device of claim 1 wherein the bias voltage source comprises a digital-to-analog converter to generate the bias voltage based on a predetermined value associated at least with the first input signal.

4. The device of claim 1 wherein the first hysteresis voltage source comprises a digital-to-analog converter to generate the first predetermined hysteresis voltage based on a predetermined value associated at least with the first input signal.

5. The device of claim 1 wherein the switch network comprises a first capacitor for holding the intermediate signal and a second capacitor for holding the offset.

6. The device of claim 1 further comprising a tail section coupled to the first drain, the tail section comprising a tail transistor and a current source.

7. The device of claim 1 further comprising a fourth transistor coupled to a supply voltage, the fourth transistor comprising a second drain coupled to the third source.

8. The device of claim 1 wherein the second frequency is least 100 times lower than the first frequency.

9. A communication system comprising:
a communication link;
a receiver comprises:
   a first input terminal comprising a first inductor and being configured to receive a first input signal from the communication link;
   a second input terminal comprising a second inductor and being configured to receive a second input signal;
   an equalizer module being configured to process the first input signal and second input signal;
   a core module comprising a first transistor and a second transistor and being coupled to the first input terminal and the second input terminal, the core module being configured to generate an input strength signal using at least the first input signal and the second input and a bias signal, the first transistor being coupled to the first input signal, the second transistor being coupled to the second input signal; and
   an output module being configured to generate a loss-of-signal indicator using at least the input strength signal and an offset associated with the first transistor and the second transistor.

10. The system of claim 9 wherein the first input terminal receives the first input signal from an optical communication channel.

11. The system of claim 9 wherein the output module comprises a latch operating at a frequency lower than an frequency of the first input signal.

12. The system of claim 9 wherein the output module comprises a switch capacitor network for determining the offset.

13. The system of claim 9 further comprising a variable-gain amplifier coupled to the equalizer module.

14. The system of claim 9 wherein the core module comprises a bias source for generating the bias signal using a DAC.

15. A method for loss-of-signal detection (LOSD), the method comprising:
   receiving an incoming signal;
   correcting the incoming signal using a hysteresis offset;
   generating an intermediate signal by subtracting a predetermined threshold voltage;
   storing a first voltage based on the intermediate signal by a first capacitor during a first phase;
   storing second voltage based at least on a common mode offset by a second capacitor during a second phase; and
   generating a loss-of-signal indication signal based the first voltage and the second voltage at a first frequency.

16. The method of claim 15 wherein the incoming signal is characterized by a second frequency, the second frequency being at least 100 times higher than the first frequency.

17. The method of claim 15 further comprising generating the predetermined threshold voltage by converting a predetermined threshold value using a DAC.

18. The method of claim 15 wherein the common mode offset is associated with a plurality of switches, the plurality of switches being configured to provide the intermediate signal.

19. The method of claim 15 wherein the second voltage being further based on the first voltage.

20. The method of claim 15 wherein the loss-of-signal indication signal comprises a digital signal having a value of "0" or "1".

* * * * *